US010170621B2

(12) United States Patent
Reboh et al.

(10) Patent No.: US 10,170,621 B2
(45) Date of Patent: Jan. 1, 2019

(54) METHOD OF MAKING A TRANSISTOR HAVING A SOURCE AND A DRAIN OBTAINED BY RECRYSTALLIZATION OF SEMICONDUCTOR

(71) Applicant: COMMISSARIAT A L'ENERGIE ATOMIQUE ET AUX ENERGIES ALTERNATIVES, Paris (FR)

(72) Inventors: Shay Reboh, Guilderland, NY (US); Perrine Batude, Dijon (FR); Flavia Piegas Luce, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 18 days.

(21) Appl. No.: 15/602,829

(22) Filed: May 23, 2017

(65) Prior Publication Data
US 2017/0345931 A1    Nov. 30, 2017

(30) Foreign Application Priority Data

May 24, 2016    (FR) ..................................... 16 54628

(51) Int. Cl.
| *H01L 29/78* | (2006.01) |
| *H01L 21/324* | (2006.01) |
| *H01L 29/06* | (2006.01) |
| *H01L 21/8234* | (2006.01) |
| *H01L 21/8238* | (2006.01) |
| *H01L 29/786* | (2006.01) |
| *H01L 21/02* | (2006.01) |
| *H01L 29/417* | (2006.01) |

(Continued)

(52) U.S. Cl.
CPC .... *H01L 29/7847* (2013.01); *H01L 21/02532* (2013.01); *H01L 21/02675* (2013.01);
(Continued)

(58) Field of Classification Search
CPC ........... H01L 29/66575; H01L 29/7838; H01L 29/7847; H01L 21/02675; H01L 29/66477;
(Continued)

(56) References Cited

U.S. PATENT DOCUMENTS

| 2002/0163036 A1 | 11/2002 | Miura et al. |
| 2008/0246041 A1* | 10/2008 | Liu .................. H01L 29/66772 |
| | | 257/77 |

(Continued)

FOREIGN PATENT DOCUMENTS

| EP | 2 840 594 A2 | 2/2015 |
| EP | 2 975 646 A1 | 1/2016 |

OTHER PUBLICATIONS

U.S. Appl. No. 14/555,897, filed Nov. 28, 2014, 2015/0155170 A1, Shay Reboh, et al.

(Continued)

*Primary Examiner* — Ermias Woldegeorgis
(74) *Attorney, Agent, or Firm* — Oblon, McClelland, Maier & Neustadt, L.L.P.

(57) ABSTRACT

Method of making a transistor, comprising the following steps:
  make a gate and a first spacer on a first channel region of a first crystalline semiconducting layer;
  make first crystalline semiconductor portions on the second source and drain regions;
  make the second regions amorphous and dope them;
  recrystallise the second regions and activate the dopants present in the second regions;
  remove the first portions;
  make a second spacer thicker than the first spacer;
  make second doped crystalline semiconductor portions on the second regions, said second portions and the second regions of the first layer together form the source and drain of the transistor.

15 Claims, 3 Drawing Sheets

(51) Int. Cl.
    *H01L 29/66*     (2006.01)
    *H01L 21/265*     (2006.01)

(52) U.S. Cl.
    CPC .......... *H01L 21/265* (2013.01); *H01L 21/324* (2013.01); *H01L 21/823418* (2013.01); *H01L 21/823814* (2013.01); *H01L 29/0649* (2013.01); *H01L 29/6656* (2013.01); *H01L 29/66575* (2013.01); *H01L 29/66628* (2013.01); *H01L 29/66772* (2013.01); *H01L 29/7838* (2013.01); *H01L 29/78618* (2013.01); H01L 21/0257 (2013.01); H01L 21/02667 (2013.01); H01L 21/26506 (2013.01); H01L 21/26513 (2013.01); H01L 29/41783 (2013.01); H01L 29/6653 (2013.01); H01L 29/66477 (2013.01)

(58) Field of Classification Search
    CPC ........... H01L 29/0649; H01L 29/41783; H01L 29/66772; H01L 29/78618; H01L 29/66628; H01L 21/02532; H01L 21/0257; H01L 21/02667; H01L 21/26506; H01L 21/324; H01L 21/26513
    See application file for complete search history.

(56) References Cited

U.S. PATENT DOCUMENTS

| | | | |
|---|---|---|---|
| 2009/0087971 A1* | 4/2009 | Colombeau ....... | H01L 29/66537 438/542 |
| 2014/0099763 A1* | 4/2014 | Alptekin .......... | H01L 21/02529 438/283 |
| 2015/0044828 A1* | 2/2015 | Batude ............. | H01L 21/26513 438/166 |

OTHER PUBLICATIONS

U.S. Appl. No. 14/575,329, filed Dec. 18, 2014, 2015/0179474 A1, Sylvain Maitrejean, et al.
U.S. Appl. No. 14/579,069, filed Dec. 22, 2014, 2015/0179665 A1, Shay Reboh, et al.
U.S. Appl. No. 14/950,416, filed Nov. 24, 2015, 2016/0149039 A1, Shay Reboh, et al.
U.S. Appl. No. 15/070,781, filed Mar. 15, 2016, 2016/0276494 A1, Sylvain Barraud, et al.
U.S. Appl. No. 15/092,002, filed Apr. 6, 2016, 2016/0300927 A1, Shay Reboh, et al.
U.S. Appl. No. 15/260,767, filed Sep. 9, 2016, 2017/0076944 A1, Emmanuel Augendre, et al.
U.S. Appl. No. 15/261,226, filed Sep. 9, 2016, 2017/0076997 A1, Shay Reboh, et al.
U.S. Appl. No. 15/452,049, filed Mar. 7, 2017, Sylvain Maitrejean, et al.
U.S. Appl. No. 15/485,246, filed Apr. 12, 2017, Perrine Batude, et al.
U.S. Appl. No. 15/523,742, filed May 2, 2017, Shay Reboh, et al.
French Preliminary Search Report dated Jan. 18, 2017 in French Application 16 54628, filed on May 24, 2016 (with English Translation of Categories of cited documents).
L. Pasini, et al. "High Performance low temperature activated devices and optimization guidelines for 3D VLSI integration of FD, TriGate, FinFET on insulator", VLSI, 2015, 2 pages.
T.W. Simpson, et al. "Amorphization threshold in Si-implanted strained SiGe alloy layers", Microstructure of Irradiated Materials, Meeting of the Materials Research Society, 1994, 9 pages.

* cited by examiner

METHOD OF MAKING A TRANSISTOR HAVING A SOURCE AND A DRAIN OBTAINED BY RECRYSTALLIZATION OF SEMICONDUCTOR

TECHNICAL DOMAIN AND PRIOR ART

The invention relates to the domain of microelectronic devices, and more particularly manufacturing of transistors, particularly of the MOS type and advantageously of the FDSOI (Fully Depleted Silicon On Insulator) type.

To satisfy high performance conditions imposed on advanced transistors in advanced technological nodes, it is desirable to make abrupt source—channel and drain—channel junctions close to the channel, that implies that doped regions corresponding to the source and drain should be made as close to the channel as possible. In particular, it is known that these junctions can be made by ion implantation of doping species in semiconducting regions that will form the source and drain of the transistor, and then annealing to thermally activate the implanted dopants. However, the reduction in transistor dimensions imposed by the most recent technological nodes creates a problem because annealing must be done at high temperature (usually more than about 1000° C.), which cause diffusion of dopants in the channel.

This diffusion of dopants in the channel can be avoided by activating dopants, in other words positioning them in a substitution site in which they are electrically active at low temperature. The document by L. Pasini et al., "High performance low temperature activated devices and optimization guidelines for 3D VLSI integration of FD, TroGate, FinFET on insulator", VLSI 2015, describes the manufacture of a thin spacer (with a thickness of between 1 and 3 nm) around the gate so that the dopants are implanted after the spacer has been produced, very close to the channel. Dopants are then activated at low temperature by Solid Phase Epitaxial Recrystallization (SPER). To achieve this, semiconductor regions that will form the source and drain are first doped by ion implantation of doping species and amorphising species (usually in two distinct implantation steps) destroying the crystalline structure of the semiconductor in which this implantation is made and making it amorphous. The amorphous semiconductor is then recrystallised at low temperature (usually less than about 700° C. and for example between about 400° C. and 600° C.), so that dopants implanted in the source and drain can be activated while avoiding diffusion of dopants in the channel.

It is complex to activate dopants by SPER for the manufacture of some transistors such as FDSOI transistors, because this technique implies that a portion of crystalline semiconductor that has not been amorphised needs to kept after ion implantation transforming the crystalline semiconductor into amorphous semiconductor, to act as a crystalline germ during subsequent recrystallisation of the semiconductor. However, the thickness of the thin semiconductor layer used to make the active zones of FDSOI transistors is usually less than or equal to about 7 nm, which implies that amorphisation, in other words transformation of crystalline semiconductor into an amorphous semiconductor, must be made for only part of the thickness of the thin layer of semiconductor so as to keep a portion of crystalline semiconductor that will be used to recrystallise the amorphous semiconductor. Furthermore, if a high quality crystalline semiconductor is to be obtained after this recrystallisation, the crystalline germ, in other words the thickness of the thin layer that is not made amorphous, must be at least 2 to 3 nm thick.

FIG. 1 diagrammatically shows an FDSOI transistor 10 obtained when the dopants are activated by SPER as described above. The transistor 10 is made in a thin semiconductor layer 12 located on a buried oxide BOX layer 14. The transistor 10 comprises a gate 16 (gate dielectric+gate conductor(s)) around which a thin spacer 18 is formed. The part of the thin layer 12 located under the gate 16 and the spacer 18 forms a channel 20 of the transistor 10. The source and drain references 22 and 24 respectively obtained with the method described above each have a doped upper part 26, 28 formed by the semiconductor portion that has been recrystallised, and a lower part 30, 32 formed by the semiconductor portion that has not been recrystallised and that acted as a crystalline germ for recrystallisation of the upper parts 26, 28.

A first problem that arises with such a transistor 10 is that only part of the thickness of the layer in which the source and drain regions 22, 24 are made has the required doping (corresponding to the upper parts 26, 28). The lower parts 30, 32 comprise undoped semiconductor with the required level, that is not desirable for the source and drain 22, 24. Moreover, it is difficult to control an ion implantation of the order of 3 to 4 nm thick, leaving a crystalline thickness of the order of 2 to 3 nm to form the crystalline germ. Finally, this implantation must be made at very low energy because the required amorphisation is only over a very small thickness. If there are any protection layers containing for example $SiO_2$ or SiN (not shown on FIG. 1) on the source and drain 22, 24 of the transistor 10, contaminants may be added into the thin semiconducting layer 12.

Document EP 2 840 594 A2 discloses a method of making a transistor in which amorphisation and recrystallisation are done after epitaxy of the transistor source and drain, to solve these problems. The thickness of semiconductor forming the source and drain is more than the thickness of the remaining part of the thin semiconducting layer, and particularly more than the portion of semiconductor forming the transistor channel. Dopants are implanted in the lower parts of the source and drain. Thus, a crystalline germ designed to activate SPER dopants is kept and formed by upper parts of the source and drain so that recrystallisation of implanted regions takes place from this germ. Consequently, dopants can be activated by SPER over the entire thickness of the semi-conductor facing the channel. Furthermore, the method avoids the need to implant dopants in a part of the semiconductor that is too thin.

However, this method has other disadvantages. With this method, the dopants are not implanted immediately adjacent to the channel because a thick spacer must be made around the gate, this spacer preventing implementation of dopants immediately adjacent to the channel even when this ion implantation is made with beams inclined from the substrate. Furthermore, this problem cannot be solved using a thin spacer around the gate because if the insulation between the gate and the epitaxied parts of the source and the drain is too thin, this would create capacitive problems within the transistor. Furthermore, at the end of this method, the crystalline structure of the semiconductor forming the source and drain is severely damaged by the different steps implemented for activation by SPER, particularly at the upper parts, and it is impossible to return to its initial state as obtained just after epitaxy. This can cause a reduction in the activation level of dopants added into the source and drain by epitaxy (in-situ doping) and a loss of stress in the case of a source and drain made from compressively strained SiGe, as is the case for a PMOS transistor.

PRESENTATION OF THE INVENTION

Therefore there is a need to disclose a method of making a transistor that does not have at least some of the disadvantages described above, namely:
  making it possible to make the source and drain as close to the channel as possible by activating dopants by SPER to prevent diffusion of dopants in the channel,
  making it possible to obtain a doped semiconductor throughout the thickness of the source and drain semiconductor facing the channel,
  not requiring the use of amorphisation by ion implantation in a thickness of the semiconductor that is too thin to be well-controlled,
  avoiding capacitive problems between the transistor source and drain and gate,
  making it possible to obtain a good activation level of dopants in the source and drain,
regardless of the thickness of the semiconductor in which the active zone of the transistor must be made, in other words also in the case of an FDSOI transistor.

To achieve this, one embodiment discloses a method of making a transistor comprising at least the following steps:
  make a gate and a first dielectric spacer in contact with the side walls of the gate, on a first region of a first crystalline semiconducting layer that will form the transistor channel;
  make first portions of crystalline semiconductor on second regions of the first layer that will form part of the transistor source and drain;
  make at least the second regions of the first layer amorphous and dope them;
  recrystallise at least the semiconductor in the second regions of the first layer and activate the dopants present at least in the semiconductor of the second regions of the first layer;
  remove the first portions;
  make a second dielectric spacer in contact with the lateral walls of the gate such that the thickness of the second dielectric spacer is more than the thickness of the first dielectric spacer;
  make second portions of doped crystalline semiconductor on the second regions of the first layer such that at least said second portions and the second regions of the first layer together form the source and drain of the transistor.

In this method, the first portions act as a sacrificial layer and are made in an "extension first" configuration so as to form an upper crystalline part acting as a crystalline germ during activation of dopants by SPER in the second regions of the first layer and possibly in a part of the first portions. After doping of the semiconductor facing the channel, in other words the semiconductor in the second regions of the first layer, the first portions are etched and then a second thicker spacer is made to avoid parasite capacitive problems between the gate and the source and drain. Finally, the source and drain are completed by making the second portions.

Therefore, with this method it is possible to choose the thickness of the first dielectric spacer such that the doped semiconductor of the source and drain can be formed immediately adjacent to the channel. Even if this first dielectric spacer is very thin, this does not cause any capacitive problems between the transistor source and drain and gate because a second thicker dielectric spacer is made later.

Furthermore, the source and drain are made as close to the channel as possible by activating dopants by SPER preventing diffusion of dopants in the transistor channel.

With this method, the entire thickness of the second regions of the first layer are composed of doped semiconductor, so that doped semiconductor can be obtained throughout the thickness of the source and drain semiconductor facing the channel.

Moreover, since the first crystalline semiconducting portions are made, this method does not require amorphisation within a thickness of the semiconductor that is so small that it cannot be well controlled.

Moreover, since the first portions are eliminated and the second portions of crystalline semiconductor that will form part of the source and drain are made at the end of the process, which means that the second portions are not exposed to amorphisation, doping and recrystallisation steps, the source and drain semiconductor is not damaged by these steps so that a good activation level of dopants can be obtained in the source and drain.

The second semiconductor portions are preferably doped in-situ by epitaxy.

Finally, this method has all the advantages presented above regardless of the thickness of the semiconductor in which the active zone of the transistor is made, and particularly in the case of an FDSOI transistor for which the thickness of the active layer may for example be less than or equal to about 7 nm.

Advantageously, the thickness of the first dielectric spacer may be between about 1 nm and 3 nm. This thickness is sufficient to dope the second regions of the first layer as close to the channel as possible.

The method may also include a step between making the second dielectric spacer and making the second portions, to etch an upper part of the second regions of the first layer such that the second portions are made on remaining parts of the second regions of the first layer and partially facing the first region of the first layer. In this case, when the second portions are subsequently made from strained semiconductor, the effect of this strain on the channel (formed by the first region of the first layer) is improved.

Amorphisation and doping of the second regions of the first layer may include implementation of a single ion implantation of doping species in the second regions of the first layer. These doping species may for example be arsenic and/or phosphorus.

As a variant, amorphisation and doping of the second regions of the first layer may include a first ion implantation of non-doping species, for example silicon and/or germanium, in the second regions of the first layer and a second ion implantation of doping species in the second regions of the first layer. With these two ion implantations (that can be such that the first ion implantation is made before the second ion implantation, or such that the second ion implantation is made before the first ion implantation), the required doping level for the semiconductor in the second regions of the first layer can be chosen independently of the quantity of ions used for the amorphisation. Ions used for amorphisation can be silicon ions, for example.

The method may be such that:
  amorphisation and doping are implemented such that they also result in amorphisation and doping of a lower part of the first portions and such that the semiconductor of an upper part of the first portions is kept in a crystalline state, and recrystallisation and activation of the dopants are done such that the semiconductor of the lower part of the first portions is also recrystallised and that dopants present in the semiconductor of the lower part of the first portions are also activated.

By making a lower part of the first portions amorphous and doping them, strains involved in making this amorphisation and this doping can be reduced, particularly when the first and second portions comprise the same semiconductor.

The method may also include a step between making the gate and the first dielectric spacer and making the first portions, to make an etching stop layer on the second regions of the first layer, to remove the first portions in this case including etching of the first portions applied until reaching the etching stop layer. The use of such an etching stop layer is advantageous because there is no need to deteriorate the upper surfaces of the second regions of the first layer during etching to remove the first portions, these surfaces obtained being very regular. The etching stop layer also precisely delimits the semiconductor to be removed before the second portions are produced.

The etching stop layer can be kept. As a variant, the method may also include a step between removal of the first portions and producing the second portions, to remove the etching stop layer (for example by etching).

The first layer may comprise silicon or SiGe comprising a proportion of germanium, for example between about 20% and 60% or between about 20% and 40%. The semiconductor in the first layer can be strained (for example strained in tension in the case of an NMOS transistor or strained in compression in the case of a PMOS transistor, the strain being either uniaxial or biaxial).

When the first layer comprises silicon, the etching stop layer may comprise SiGe containing a proportion of germanium, for example between about 10% and 50%, or when the first layer comprises SiGe, the etching stop layer can comprise silicon and/or SiGe in which the proportion of germanium is for example at least 5% or at least 10% more than the proportion of SiGe in the first layer.

For example, the thickness of the etching stop layer may be between 1 nm and 5 nm. The semiconductor in the etching stop layer can be doped and/or strained, which is advantageous when the etching stop layer is kept. The semiconductor in the etching stop layer is strained when the composition and/or the nature of this semiconductor is different from the composition and/or the nature of the semiconductor in the first layer.

The method may be such that:
when the transistor is of the NMOS type, the first and/or second portions comprise N type doped silicon and/or or silicon strained in tension (uniaxially or biaxially), or
when the transistor is of the PMOS type, the first portions comprise P type doped silicon and/or silicon strained in compression (uniaxially or biaxially), and/or the second portions comprise P type doped SiGe for which the proportion of germanium is between 20% and 60%.

BRIEF DESCRIPTION OF THE DRAWINGS

This invention will be better understood after reading the description of example embodiments given purely for information and in no way limitative with reference to the appended drawings on which.

Figure 1:
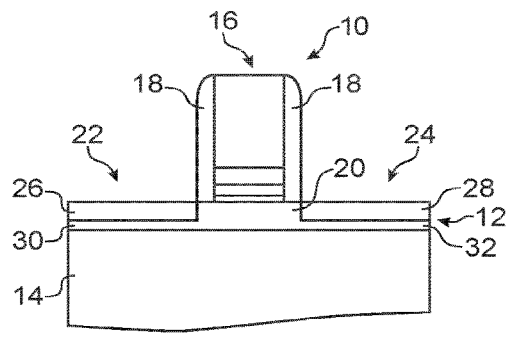
FIG. 1 diagrammatically shows an FDSOI transistor obtained when dopants are activated by classical SPER.

Identical, similar or equivalent parts of the different figures described below have the same numeric references to facilitate the comparison between different figures.

The different parts shown on the figures are not necessarily all at the same scale, to make the figures more easily understandable.

The different possibilities (variants and embodiments) must be understood as not being mutually exclusive and can be combined with each other.

DETAILED PRESENTATION OF PARTICULAR EMBODIMENTS

Refer firstly to FIGS. 2 to 7 that show steps in a first embodiment of a method of making a transistor 100.

The transistor 100 in this case is of the NMOS type and is made from a semiconductor on insulator type substrate, for example of the SOI (silicon on insulator) type and comprising a thick semiconducting layer (not shown on FIGS. 2 to 7) on which there is a buried oxide (BOX) dielectric layer 102, for example comprising $SiO_2$ and the thickness of which may for example be of the order of 20 nm, itself covered with a first layer 104 of crystalline semiconductor, in this case comprising silicon for example with a thickness of between about 4 nm and 8 nm. Silicon in the first layer 104 may or may not be strained in tension.

Deposition, photolithography and etching steps are then implemented to make a gate dielectric and one or more gate conductors that together form a gate 112 of the transistor 100, on a first region 106 of the first layer 104 that will form the channel of the transistor 100.

Figure 2:
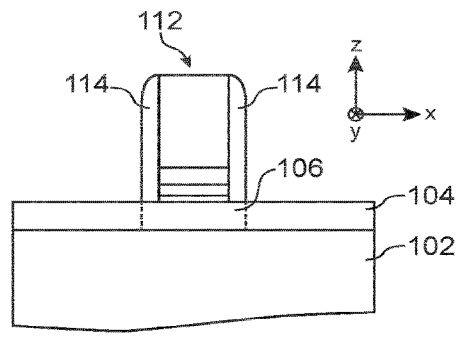
FIGS. 2 to 7 show steps in a first embodiment of a method of making a transistor.

A first dielectric spacer 114 is then made on the first region 106 and around the gate 112, in other words adjacent to the lateral walls or flanks of the gate 112 (see FIG. 2). The first spacer 114 for example comprises SiN and is thin, in other words its thickness (direction parallel to the X axis shown on FIG. 2) is for example between about 1 nm and 3 nm.

Figure 3:
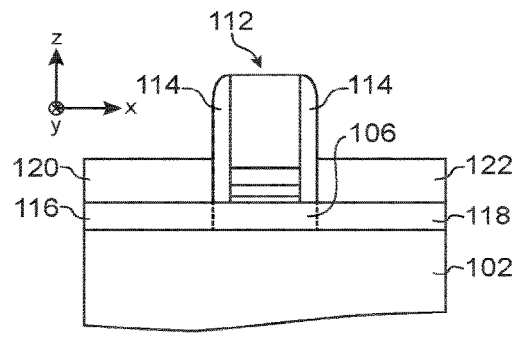

As shown on FIG. 3, a first epitaxy is then implemented on access regions of the transistor 100, in other words on the second regions 116, 118 of the first layer 104 that will form part of the source and drain regions of the transistor 100, forming the first portions 120, 122 of the crystalline semiconductor located on the second regions 116, 118 of the first layer 104. On FIG. 3, the first region 106 and the second regions 116, 118 of the first layer 104 are symbolically delimited from each other by dashed lines. The first portions 120, 122 made are higher than the level of the first region 106 and the second regions 116, 118. Therefore these first portions 120, 122 are placed in contact with parts of external lateral walls of the first dielectric spacer 114 and are not arranged facing the first region 106. Moreover, each of these first portions 120, 122 has a thickness (dimension parallel to the Z axis shown on FIG. 3) that is for example between about 5 nm and 15 nm. This first epitaxy can be carried out such that the first portions 120, 122 comprise doped or undoped semiconductor, for example N type Si doped with phosphorus.

The semi-conductor of the first portions 120, 122 can also be elastically strained in tension. According to one variant embodiment, the semiconductor obtained by this first epitaxy can contain a low concentration of carbon, for example between about 0.5% and 2%, which confers a smaller mesh parameter on the crystalline semiconductor of the first portions 120, 122 than the mesh parameter of the semiconductor in the second regions 116, 118 that does not contain any carbon, thus conferring a tensile strain on the semiconductor of the first regions 120, 122.

Figure 4:
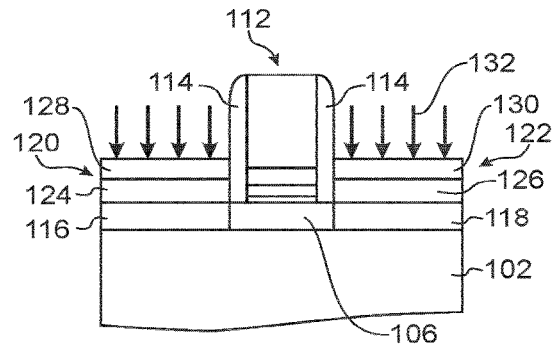

As shown on FIG. 4, one or several ion implantation steps are implemented such that dopants are implanted throughout the thickness of the second regions 116, 118 of the first layer 104. In the first embodiment described herein, dopants are also implanted in lower parts 124, 126 of the first portions 120, 122. This or these ion implantations destroy the crystalline structure of the lower parts 124, 126 of the first portions 120, 122 and the second regions 116, 118 and make this semiconductor amorphous. Therefore the lower parts 124, 126 of the first portions 120, 122 and the second regions 116, 118 together form amorphous semiconducting regions that are thicker than the first layer 104. Upper parts 128, 130 of the first portions 120, 122 are passed through by ion beams 132 used during this or these implantations without these ions destroying the crystalline structure of the semiconductor of these upper parts 128, 130. Therefore the upper parts 128, 130 of the first portions 120, 122 keep the crystalline semiconductor that will subsequently be used for recrystallisation of the amorphous semiconductor in the lower parts 124, 126 and the second regions 116, 118.

The amorphous semiconductor can be obtained by means of a first implantation of $Si^+$ ions and then a second implantation of dopant ions, for example phosphorus or arsenic, in the second regions 116, 118 of the first layer 104 and in the lower parts 124, 126 of the first portions 120, 122. As a variant, the implantation of dopant species can be applied before the implantation of non-dopant species. It would also be possible for a single implantation of ions of dopant species, for example phosphorus ions, to be used. Ions may be implanted for example with an energy of between about 15 keV and 40 keV and with a dose par example equal to between about $1\times10^{14}$ at/cm² and $5\times10^{14}$ at/cm². Implanted ion species and the energy and doses with which these ions are implanted are chosen particularly as a function of the thickness and the nature of semiconductors of the second regions 116, 118 of the first layer 104 and the first portions 120, 122.

A recrystallisation to transform the amorphous semiconductor of the second regions 116, 118 of the first layer 104 and the lower parts 124, 126 of the first portions 120, 122 into crystalline semiconductor in which dopants are activated by SPER is then implemented. To achieve this, the entire structure formed above can be annealed, for example under an inert atmosphere, the temperature of this annealing for example being between about 500° C. and 800° C. and its duration may be between a few seconds, for example less than 10 seconds when the temperature is high (for example equal or approximately equal to 800° C.), and a few minutes (for example less than 30 minutes) when the temperature is lower (equal or approximately equal to 500° C.).

Figure 5:
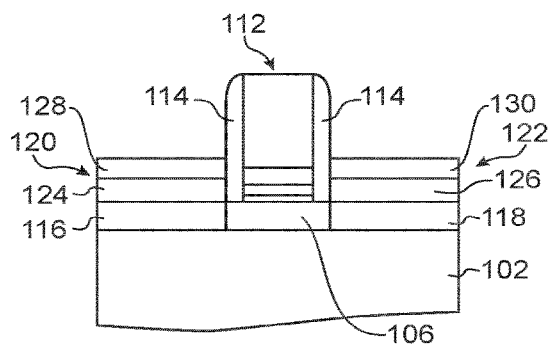

Recrystallisation of the amorphous semiconductor takes place due to the crystalline semiconductor of the upper parts 128, 130 of the first portions 120, 122 that forms a recrystallisation front for the amorphous semiconductor in the lower parts 124, 126 of the first portions 120, 122 and then for the amorphous semiconductor of the second regions 116, 118 of the first layer 104. Furthermore, this annealing and the SPER recrystallisation approach also activate dopants implanted in the semiconductor of the second regions 116, 118 of the first layer 104 and the lower parts 124, 126 of the first portions 120, 122. After this recrystallisation and this activation of dopants, the second regions 116, 118 of the first layer 104 and the lower parts 124, 126 of the first portions 120, 122 comprise doped crystalline semiconductor (FIG. 5).

As a variant, this recrystallisation and this activation of dopants can be implemented by a laser to locally heat the semiconductor of the second portions 116, 118 of the first layer 104 and the upper parts 124, 126 of the first portions 120, 122.

During recrystallisation, the mesh parameter of the crystalline semiconductor of the first portions 120, 122 (of the upper parts 128, 130 in this case) is at least partially transferred to the semiconductor located under it, in other words the semiconductor of the second regions 116, 118 of the first layer 104. Thus, if the semiconductor of the first portions 120, 122 is strained, this strain can be transferred into the semiconductor in the second regions 116, 118 of the first layer 104.

Figure 6:
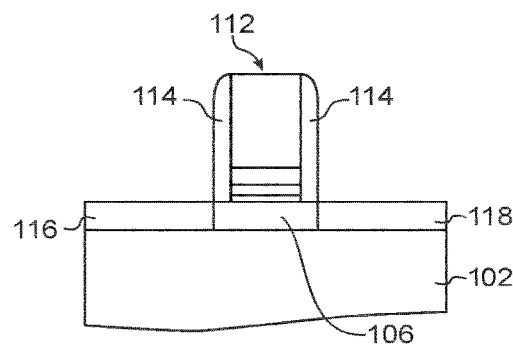

As shown on FIG. 6, the entire semiconductor of the first portions 120, 122, in other words both the upper parts 128, 130 and the lower parts 124, 126, are then removed, in this case by etching. The thickness of the remaining portions of doped crystalline semiconductor is very similar to the thickness of the first region 106 that will form the channel of the transistor 100 and correspond to the second regions 116, 118 of the first layer 104.

A second dielectric spacer 138 is then made by depositing a dielectric material, for example SiN, around the first dielectric spacer 114. The thickness (along the direction parallel to the X axis shown on FIG. 7) of the second dielectric spacer 138 (formed from the removed dielectric material and the first dielectric spacer 114) is equal for example to between about 3 nm and 10 nm. This second dielectric spacer 138 is formed on portions of the second regions 116, 118 that are juxtaposed on the first region 106.

As a variant, the first dielectric spacer 114 can be removed and the second dielectric spacer 138 can then be made such that it occupies the volume previously occupied by the first dielectric spacer 114.

A second epitaxy is then implemented from the doped crystalline semiconductor of the second regions 116, 118 that is not covered by dielectric spacers 114, 138, forming second portions 140, 142 of doped crystalline semiconductor (in this case N type by phosphorus ions). These second portions 140, 142 and the second regions 116, 118 form the source and drain 144, 146 of the transistor 100 (see FIG. 7).

Like the first semiconducting portions 120, 122, the semiconductor of the second portions 140, 142 can be strained in tension. To achieve this, the semiconductor obtained by this second epitaxy can contain a low concentration of carbon, for example between about 0.5% and 2%, which confers a smaller mesh parameter on the crystalline semiconductor of the second portions 140, 142 than the mesh parameter of the semiconductor in the second regions 116, 118 that does not contain any carbon, thus conferring a tensile strain on the semiconductor of the second portions 140, 142, this tensile strain inducing a tensile strain in the channel of the transistor 100.

According to one advantageous variant of this embodiment, a step could be performed between production of the second dielectric spacer 138 and the second epitaxy, to etch an upper part of the second regions 116, 118 of the first layer 104. Thus, the second portions 140, 142 are then made on the remaining parts of the second regions 116, 118 and therefore partially facing the first region 106, in other words the channel of the transistor 100. This variant is particularly advantageous when the second portions 140, 142 comprise strained semiconductor (in tension in the case of an NMOS transistor) because this strain is then better reproduced in the channel of the transistor.

According to another variant of this first embodiment, the ion implantation(s) are done only in the semiconductor in the second regions 116, 118. In this case, after the recrystallisation annealing and activation of dopants, only the second regions 116, 118 comprise doped crystalline semiconductor, and the first portions 120, 122 are entirely composed of only slightly doped crystalline semiconductor.

FIGS. 8 to 12 show some of the steps in a second embodiment of a method of making the transistor 100.

Figure 8:
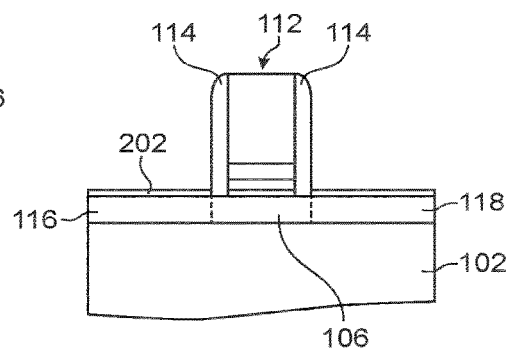
FIGS. 8 to 12 show some of the steps in a second embodiment of a method of making a transistor.

The first step is to make a structure similar to that described with reference to FIG. 2. The next step is that an etching stop layer 202 resistant to the etching agent used to etch the semiconductor of the first portions 120, 122 that will be formed later (in other works with an etching rate by this etching agent lower than the etching rate at which the first portions 120, 122 are etched by this etching agent) is then deposited on the parts of the first layer 104 not covered by the gate 112 and the first dielectric spacer 114, in other words on the second regions 116, 118 of the first layer 104 (FIG. 8). When the first portions 120, 122 that will be made by epitaxy on the etching stop layer 202 comprise silicon, the etching stop layer 202 advantageously comprises SiGe for which the proportion of germanium is between about 10% and 50%, for example. For example, the thickness of the etching stop layer 202 is between 1 nm and 5 nm. The semiconductor of the etching stop layer 202 may or may not be doped (in situ doping during epitaxy). The etching stop layer 202 may comprise SiGe for an NMOS or PMOS type transistor 100, or it may comprise SiGe:B for a PMOS type transistor 100.

Figure 9:
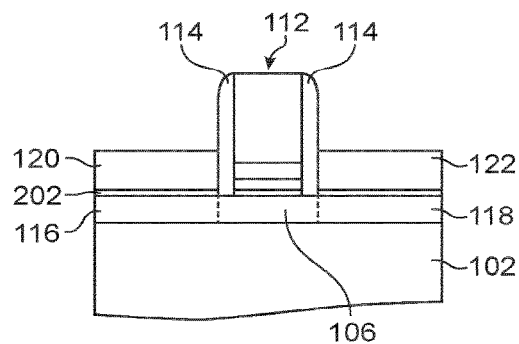

As shown on FIG. 9, epitaxy is then used in a manner similar to that described above with reference to FIG. 3, forming the first portions 120, 122 in this case containing silicon.

As described above, the semiconductor of portions 120, 122 can be strained in tension and/or N type doped for an NMOS type transistor 100 or P type doped for a PMOS type transistor 100.

Then, as described above with reference to FIG. 4, one or several ion implantation steps are implemented such that dopants are implanted throughout the thickness of the second regions 116, 118 of the first layer 104 and in the lower portions 124, 126 of the first portions 120, 122. These dopants are also implanted in the semiconductor in the etching stop layer 202 that is located between the second regions 116, 118 of the first layer 104 and the first portions 120, 122. Preferably, in making a P type transistor, a first implantation of non-doping species such as silicon and/or germanium (for amorphisation) is made, and doping species such as boron are then implanted during a second implantation. As a variant, the second implantation can be made before the first implantation. P and/or As ions can be used to make an N type transistor.

Figure 10:
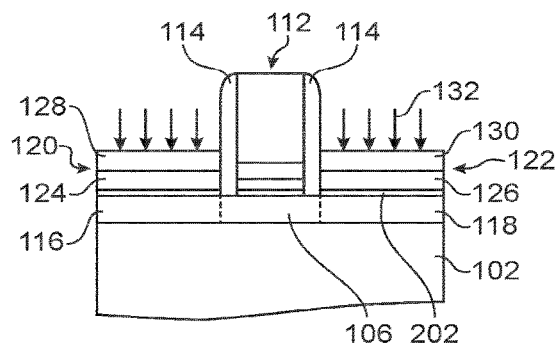

The crystalline silicon and SiGe in which this ion implantation is made become amorphous semiconductors, the total thickness of the semiconductor thus formed being more than the thickness of the first layer 140 (FIG. 10). This ion implantation can be implemented with parameters similar to those described above for the first embodiment.

Figure 11:
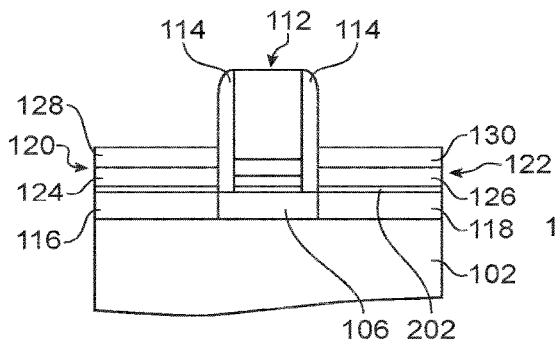

As shown on FIG. 11, a recrystallisation of the amorphous semiconductor of the second regions 116, 118 of the first layer 104 and the lower parts 124, 126 of the first portions 120, 122 and an activation of dopants implanted in this amorphous semiconductor by SPER are then done through the use of annealing of the entire structure and/or local recrystallisation by laser, as described above with reference to FIG. 5. Apart from the semiconductor of the second regions 116, 118 of the first layer 104 and the semiconductor of the lower parts 124, 126 of the first portions 120, 122 that has become crystalline and then doped subsequent to this recrystallisation and this activation by SPER, the semiconductor of the etching stop layer 202 is also recrystallised and becomes the doped semiconductor after these steps have been performed.

Figure 12:
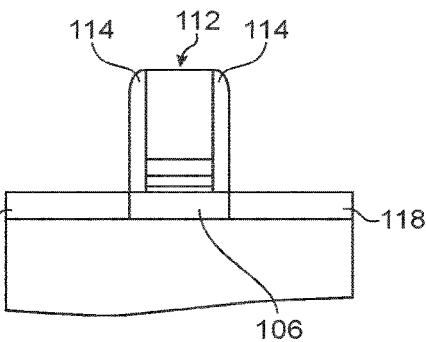
Figure 13:
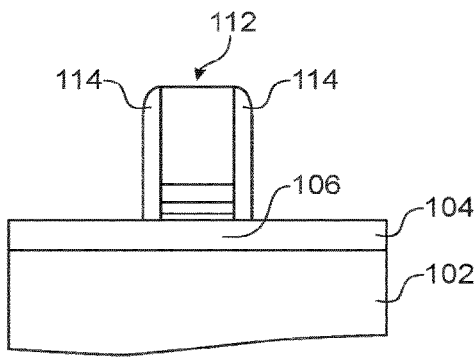
FIGS. 13 to 18 show some of the steps in a third embodiment of a method of making a transistor.

As shown on FIG. 12, the first portions 120, 122 are then removed by etching. Due to the presence of the etching stop layer 202, this etching is well controlled and the second regions 116, 118 of the first layer 104 are not deteriorated and therefore the thickness of semiconductor remaining adjacent to the first region 106 can be well controlled.

A second etching is then done to eliminate the etching stop layer 202. The structure obtained at this stage of the method corresponds to the structure previously described with reference to FIG. 6, however with the second regions 116, 118 of the first layer 102 having very regular upper surfaces not damaged by the etching used to remove the first portions 120, 122.

As a variant, the etching stop layer 202 may be kept.

Figure 7:
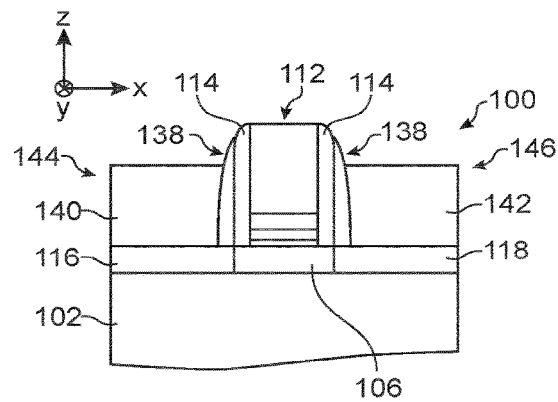

The transistor 100 is then completed in a manner similar to that described above for the first embodiment with reference to FIG. 7, in other words forming the second dielectric spacer 138 and performing epitaxy forming the second portions 140, 142 (on the second regions 116, 118 of the first layer 102 if the etching stop layer 202 is removed or on the etching stop layer 202 if it is kept), thus completing production of the source and drain 144, 146 of the transistor 100.

The different variant embodiments described above for the first embodiment can also be applied to this second embodiment.

We will now describe the steps in a third embodiment of making the transistor 100 with reference to FIGS. 13 to 18.

The transistor 100 in this case is of the PMOS type and is made from a semiconductor on insulator type substrate, for example of the SGOI (silicon-germanium on insulator) type and comprising a thick semiconducting layer (not shown on FIGS. 13 to 18) on which a buried oxide dielectric layer 102 is located, for example comprising $SiO_2$ and the thickness of which may for example be of the order of 25 nm, itself covered with a first layer of semiconductor 104, in this case comprising SiGe for example with a thickness of between about 5 nm and 8 nm. The SiGe in the first layer 104 may or may not be strained in compression, and the proportion of germanium can be between about 20% and 60% or between about 20% and 40%.

The gate 112 and the first spacer 114 are then made on the first layer 104, as described earlier for the first embodiment.

Figure 14:
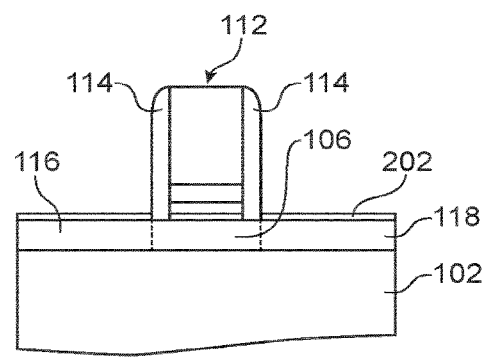

As in the second embodiment, the etching stop layer 202 is then made on the first layer 104, on the second regions 116, 118 (FIG. 14). The etching stop layer 202 may included doped or undoped SiGe. In the case in which the etching stop layer 202 is made of doped SiGe, the doping in this case is of the P type (since in this case the transistor 100 is of the PMOS type) and is obtained for example by implantation of boron ions. The thickness of the etching stop layer 202 may be between about 1 nm and 5 nm, and the proportion of germanium in SiGe can be between about 10% and 50%. When the first layer 104 comprises SiGe, as is the case here, the etching stop layer 202 can comprise SiGe with a proportion of germanium equal to at least 5% more than the proportion of germanium in the SiGe in the first layer 104.

Figure 15:
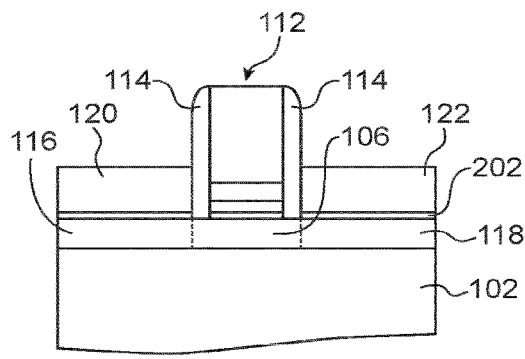

As shown on FIG. 15, a first epitaxy is performed as described above in the previous two embodiments, forming the first portions 120, 122, in this case composed of silicon. The semiconductor of the first portions 120, 122 may be doped as P type or may be undoped, and may be strained in compression.

Figure 16:
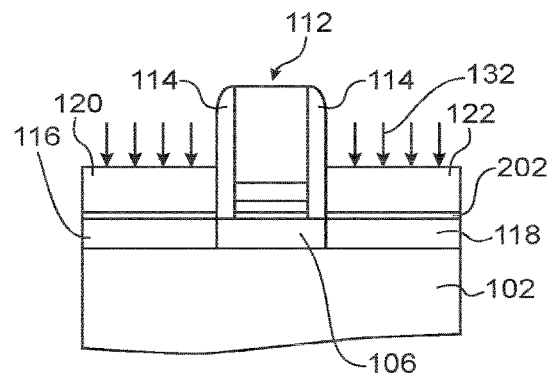

Then as described above with reference to FIGS. 4 and 10, one or several ion implantation steps are implemented such that dopants are implanted throughout the thickness of the second regions 116, 118 of the first layer 104 (FIG. 16). In this case, the dopants are also implanted in the etching stop layer 202. A first implantation of $Si^+$ or $Ge^+$ ions followed by a second implantation of $B^+$ or $BF_2^+$ type doping ions, for example, are performed in this third embodiment. The semiconductor of the second regions 116, 118 of the first layer 104 in which this ion implantation is performed becomes an amorphous semiconductor. This ion implantation can be implemented with parameters (energy, dose, etc.) similar to those described above for the first and second embodiments, and adapted as a function of the thicknesses and the materials present. The implantation energies and doses used to form the amorphous semiconductor can be adapted such that the SiGe in the second regions 116, 118 of the first layer 104 and the etching stop layer 202 are amorphised selectively relative to the silicon in the first portions 120, 122. Examples of the implementation of such selected amorphisation are described for example in the document written by T. W. Simpson et al., "Amorphization threshold in Si-implanted strained SiGe alloy layers ", Microstructure of Irradiated Materials, 1994, Meeting of the Materials Research Society.

Figure 17:
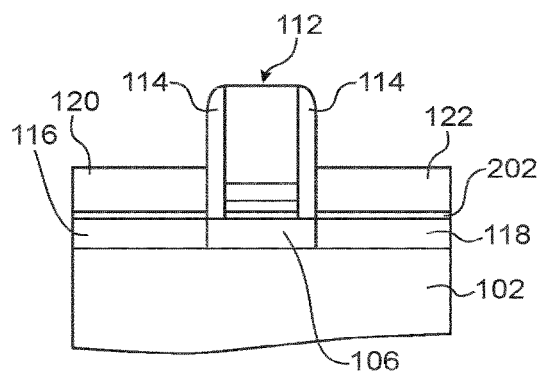

As shown on FIG. 17, a recrystallisation of the amorphous semiconductor of the second regions 116, 118 of the first layer 104 (and also of the etching stop layer 202) and an activation of dopants implanted in this amorphous semiconductor are then done through the use of annealing of the entire structure and/or local recrystallisation by laser, as described above with reference to FIGS. 5 and 11. If the crystalline semiconductor of the first portions 120, 122 is silicon and the crystalline semiconductor of the first layer 104 is SiGe, the recrystallised SiGe in the second regions 116, 118 may become at least partially strained in compression.

Figure 18:
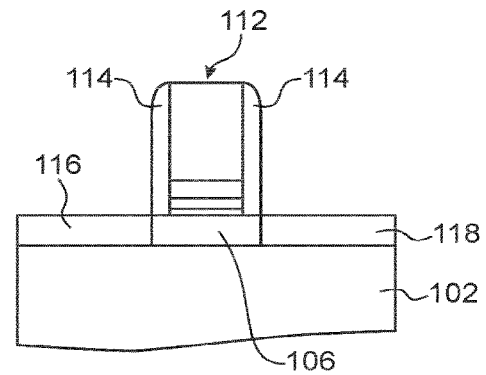

As shown on FIG. 18, the first portions 120, 122 are then removed by etching. Due to the presence of the etching stop layer 202, this etching is well controlled and the second regions 116, 118 of the first layer 104 are not deteriorated and therefore the thickness of semiconductor remaining adjacent to the first region 106 is well controlled.

A second etching is then done to eliminate the etching stop layer 202.

The transistor 100 is then completed in a manner similar to that described above for the first embodiment with reference to FIG. 7, in other words forming the second dielectric spacer 138 and performing a second epitaxy forming the second portions 140, 142, thus completing production of the source and drain 144, 146 of the transistor 100. In this third embodiment, the semiconductor of the second portions 140, 142 is advantageously P type doped SiGe (for example with boron ions) in which the proportion of germanium is between about 20% and 60% such that the source and drain 144, 146 are strained in compression and that there is a compression strain in the channel of the transistor 100.

The different variant embodiments described above for the first and second embodiments can also be applied to this second embodiment. Moreover, this third embodiment can be used without making the etching stop layer 202.

The invention claimed is:

1. Method of making a transistor, comprising:
    forming a gate and a first dielectric spacer in contact with the side walls of the gate, on a first region of a first layer that will form the transistor channel, the first layer being a crystalline semiconducting layer;
    forming first portions of crystalline semiconductor on second regions of the first layer that will form part of the transistor source and drain;
    making at least the second regions of the first layer amorphous and doping them;
    recrystallizing at least the semiconductor in the second regions of the first layer and activating the dopants present at least in the semiconductor of the second regions of the first layer;
    removing the first portions;
    forming a second dielectric spacer in contact with the lateral walls of the gate such that the thickness of the second dielectric spacer is more than the thickness of the first dielectric spacer;
    forming second portions of doped crystalline semiconductor on the second regions of the first layer such that at least said second portions and the second regions of the first layer together form the source and drain of the transistor.

2. Method according to claim 1, in which the first layer is a surface layer of a semiconductor on insulator type substrate.

3. Method according to claim 2, in which the transistor is of the FDSOI type and the thickness of the first layer is between about 4 nm and 8 nm.

4. Method according to claim 1, further comprising forming, between the forming the gate and the first dielectric spacer and the forming the first portions, an etching stop layer on the second regions of the first layer, and removing the first portions includes etching of the first portions until reaching the etching stop layer.

5. Method according to claim 4, further comprising removing, between the removal of the first portions and the forming the second portions, the etching stop layer.

6. Method according to claim 1, in which the thickness of the first dielectric spacer is between about 1 nm and 3 nm.

7. Method according to claim 1, in which the forming of the second dielectric spacer includes depositing dielectric material around the first dielectric spacer such that said dielectric material and the first dielectric spacer together form the second dielectric spacer, or the forming of the second dielectric spacer includes removal of the first dielectric spacer followed by deposition of dielectric material forming the second dielectric spacer.

8. Method according to claim 1, further comprising etching, between the forming the second dielectric spacer and the forming the second portions, an upper part of the second regions of the first layer such that the second portions are made on remaining parts of the second regions of the first layer and partially facing the first region of the first layer.

9. Method according to claim 1, in which the first and second portions are made by epitaxy.

10. Method according to claim 1, in which the amorphisation and doping of the second regions of the first layer include implementation of a single ion implantation of doping species in the second regions of the first layer.

11. Method according to claim 1, in which the amorphisation and doping of the second regions of the first layer include a first ion implantation of non-doping species in the second regions of the first layer and a second ion implantation of doping species in the second regions of the first layer.

12. Method according to claim 1, in which the recrystallisation and activation of dopants include the use of at least one of:
- annealing under an inert atmosphere at a temperature between about 500° C. and 800° C.,
- local heating of the semiconductor containing the dopants by laser.

13. Method according to claim 1, in which:
- amorphisation and doping are implemented such that they also result in amorphisation and doping of a lower part of the first portions and such that the semiconductor of an upper part of the first portions is kept in a crystalline state, and
- recrystallisation and activation of the dopants are done such that the semiconductor of the lower part of the first portions is also recrystallised and that dopants present in the semiconductor of the lower part of the first portions are also activated.

14. Method according to claim 1, in which the first layer comprises silicon or SiGe comprising a proportion of germanium between about 20% and 60%.

15. Method according to claim 1, in which:
- when the transistor is of the NMOS type, the first and/or second portions comprise N type doped silicon and/or or silicon strained in tension, and
- when the transistor is of the PMOS type, the first portions comprise P type doped silicon and/or silicon strained in compression, and/or the second portions comprise P type doped SiGe for which the proportion of germanium is between 20% and 60%.

* * * * *